(12) United States Patent
Arai et al.

(10) Patent No.: US 6,759,274 B2
(45) Date of Patent: Jul. 6, 2004

(54) SEMICONDUCTOR CHIP PICK-UP METHOD

(75) Inventors: Kazuhisa Arai, Tokyo (JP); Toshiaki Takahashi, Tokyo (JP); Kouichi Yajima, Tokyo (JP)

(73) Assignee: Disco Corporation, Tokyo (JP)

( * ) Notice: Subject to any disclaimer, the term of this patent is extended or adjusted under 35 U.S.C. 154(b) by 280 days.

(21) Appl. No.: 09/929,103

(22) Filed: Aug. 15, 2001

(65) Prior Publication Data

US 2002/0025656 A1 Feb. 28, 2002

(30) Foreign Application Priority Data

Aug. 29, 2000 (JP) ........................................ 2000-258946

(51) Int. Cl.[7] .............................................. H01L 21/304
(52) U.S. Cl. ........................ 438/114; 438/118; 414/941
(58) Field of Search ................................. 438/107, 108, 438/109, 110, 111, 112, 113, 114, 460, 464, FOR 380, 118; 414/941

(56) References Cited

U.S. PATENT DOCUMENTS 5,571,594 A * 11/1996 Minowa et al. ............. 118/423
5,975,402 A * 11/1999 Kim ............................. 228/43
6,238,515 B1 * 5/2001 Tsujimoto et al. ......... 156/379.8

FOREIGN PATENT DOCUMENTS

| JP | 10-118920 | 5/1998 |
| JP | 2000-25881 | 1/2000 |
| JP | 2000-158334 | 6/2000 |

* cited by examiner

Primary Examiner—George Fourson
(74) Attorney, Agent, or Firm—Smith, Gambrell & Russell, LLP (57) ABSTRACT

A method of picking up a plurality of semiconductor chips formed by dividing a semiconductor wafer comprises the step of adhesively holding the plurality of semiconductor chips on an elastic adhesive pad which has innumerable pores in the surface and generates adhesion force when negative pressure is produced by the pores crushed by restoration force generated by elasticity and adhesion, and the step of picking up the semiconductor chips in a state of air in the pores being expanded by heating the elastic adhesive pad which adhesively holds the plurality of semiconductor chips at a predetermined temperature.

3 Claims, 7 Drawing Sheets

SEMICONDUCTOR CHIP PICK-UP METHOD

FIELD OF THE INVENTION

The present invention relates to a method of picking up semiconductor chips formed by dividing a semiconductor wafer along predetermined cutting lines.

DESCRIPTION OF THE PRIOR ART

In the production process of a semiconductor device, a circuit such as an IC or LSI is formed in a large number of areas arranged in a lattice form on the surface of a substantially disk-like semiconductor wafer and each area having the circuit formed therein is diced along predetermined cutting lines to produce a semiconductor chip. To improve the heat radiation property of the semiconductor chip, the thickness of the semiconductor chip is desirably made as small as possible. To enable the downsizing of portable telephones, smart cards, personal computers and the like in which a large number of semiconductor chips are used, the semiconductor chip is desirably formed as thin as possible. To this end, before the semiconductor wafer is divided into semiconductor chips, the back surface of the semiconductor wafer is ground to a predetermined thickness. As a technology capable of further reducing the thickness of the semiconductor chip to be divided, there has also been developed a processing method so-called "pre-dicing" which comprises forming dicing grooves having a predetermined depth in the surface of the semiconductor wafer before the grinding of the back surface of the semiconductor wafer, and grinding the back surface of the semiconductor wafer until the dicing grooves are exposed to divide the semiconductor wafer into semiconductor chips.

Since a protective tape mounted on a ring frame is affixed to the semiconductor wafer before it is divided into semiconductor chips in the above-described manner, the obtained semiconductor chips are not separated from one another by the action of the protective tape and held on the protective tape mounted on the ring frame. A plurality of semiconductor chips thus obtained are sent to a pick-up step such as a die bonder or the like while they are held on the protective tape mounted on the ring frame. Heretofore, in the pick-up step, the semiconductor chips have been pushed up by a thrusting pin while the above protective tape is adsorbed by a back-up holder to separate the semiconductor chips from the protective tape, and the separated semiconductor chips have been picked up by a collet and stored in a predetermined package or a conveying tray.

The semiconductor chip formed thin as described above is, however, liable to be broken due to reduced rigidity and may be often damaged when they are pushed up by the thrusting pin in the above pick-up step, resulting in reduced yield. In the above conventional pick-up method, even when a plurality of semiconductor chips formed by dividing the semiconductor wafer can be picked up and transferred to a conveying tray en bloc, they must be picked up one by one, thereby making it impossible to improve productivity.

Meanwhile, the applicant has proposed in Japanese Laid-open Patent Applications 25881/2000 and 158334/2000 (JP-A 2000-25881 and JP-A 2000-158334) a tray comprising an elastic adhesive pad with innumerable pores in the surface for adhesively holding a plate-like workpiece, making use of negative pressure produced when the pores are crushed by restoration force generated by elasticity and adhesion, in order to enable a thin plate-like workpiece having low rigidity to be carried easily. When the plate-like workpiece adhesively held on the tray comprising the elastic adhesive pad is to be separated from the elastic adhesive pad after it has been carried to a predetermined processing step, negative pressure in the pores formed in the surface of the elastic adhesive pad is reduced by supplying air to the elastic adhesive pad, whereby the plate-like workpiece is separated from the elastic adhesive pad. However, in the above method of supplying air to the elastic adhesive pad, it is difficult to supply air to all the pores formed innumerably in the surface of the elastic adhesive pad and considerable suction force may often remain in the elastic adhesive pad. In this case, when the plate-like workpiece is very thin and has low rigidity like a semiconductor wafer or semiconductor chip, it is damaged at the time of separation from the elastic adhesive pad.

SUMMARY OF THE INVENTION

It is an object of the present invention to provide a semiconductor chip pick-up method capable of picking up a semiconductor chip formed by dividing a semiconductor wafer without damaging them, and, as required, picking up a plurality of divided semiconductor chips en bloc.

To attain the above object, according to the present invention, there is provided a method of picking up a plurality of semiconductor chips formed by dividing a semiconductor wafer, comprising:

the semiconductor chip holding step of adhesively holding the plurality of semiconductor chips on an elastic adhesive pad which has innumerable pores formed in the surface and generates adhesive force when negative pressure is produced by the pores crushed by restoration force generated by elasticity and adhesion; and the semiconductor chip picking up step of picking up the semiconductor chips in a state of air in the pores being expanded by heating the elastic adhesive pad which adhesively holds the plurality of semiconductor chips, at a predetermined temperature.

According to the present invention, there is also provided a method of picking up a plurality of semiconductor chips formed by dividing a semiconductor wafer by forming cutting grooves having a predetermined depth in the surface of the semiconductor wafer, affixing a protective tape to the surface having the cutting grooves formed therein and grinding the back surface of the semiconductor wafer until the cutting grooves are exposed, comprising:

the semiconductor chip holding step of adhesively holding the plurality of semiconductor chips on an elastic adhesive pad which has innumerable pores formed in the surface and generates adhesive force when negative pressure is produced by the pores crushed by restoration force generated by elasticity and adhesion, by putting the ground surfaces of the plurality of semiconductor chips, to which the protective tape has been affixed, onto the elastic adhesive pad;

the protective tape separating step of separating the protective tape affixed to the semiconductor chips in a state of the plurality of semiconductor chips being adhesively held on the elastic adhesive pad; and the semiconductor chip picking up step of picking up the semiconductor chips in a state of air in the pores being expanded by heating the elastic adhesive pad which adhesively holds the plurality of semiconductor chips, at a predetermined temperature.

The above semiconductor chip holding step desirably includes the step of stretching the above protective tape to broaden the interval between adjacent semiconductor chips.

DETAILED DESCRIPTION OF THE PREFERRED EMBODIMENTS

Preferred embodiments of the semiconductor chip pick-up method of the present invention will be described in detail with reference to the accompanying drawings hereinafter.

To carry out the semiconductor chip pick-up method of the present invention, a plate-like workpiece holding tray which comprises an elastic adhesive pad for holding a plate-like workpiece such as a semiconductor wafer or semiconductor chip is prepared. This plate-like workpiece holding tray will be described with reference to FIGS. 1 to 3.

Figure 1:
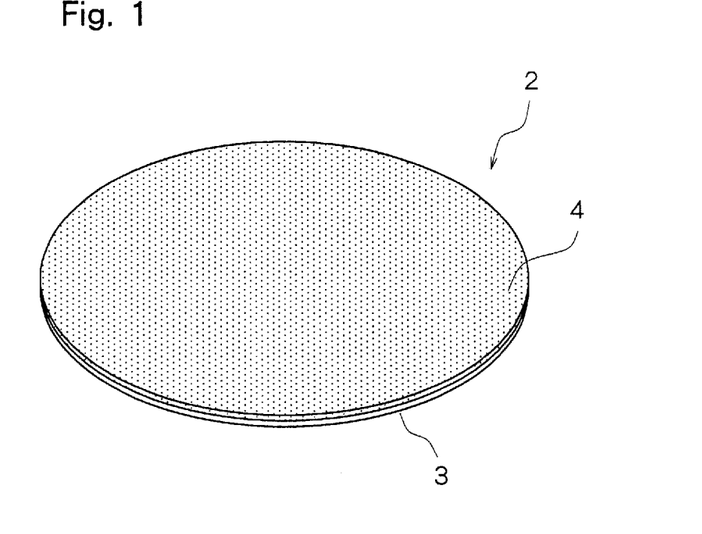
FIG. 1 is a perspective view of a plate-like workpiece holding tray comprising an elastic adhesive pad.
Figure 2:
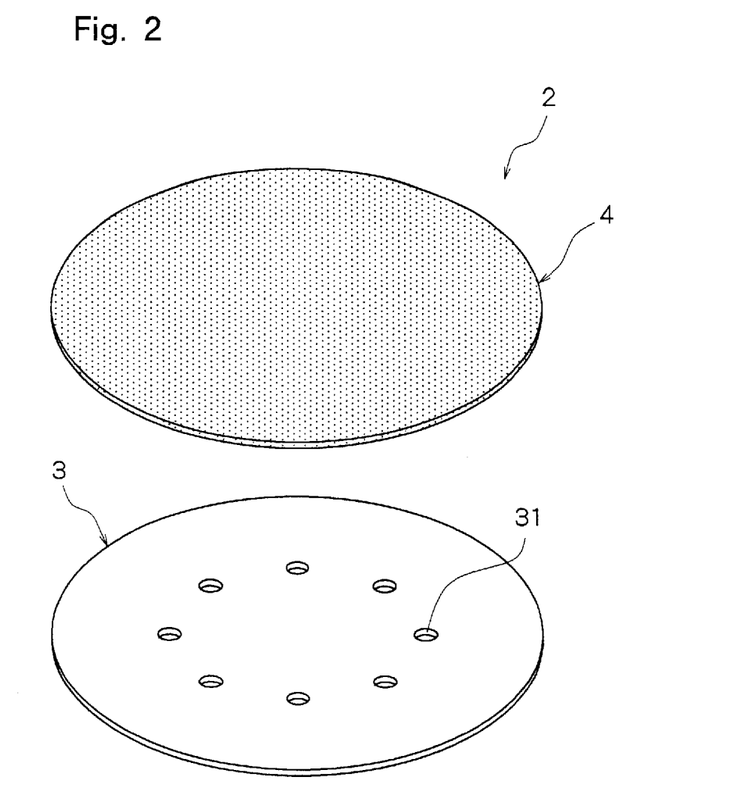
FIG. 2 is an exploded perspective view of the constituent members of the plate-like workpiece holding tray shown in FIG. 1.
Figure 3:
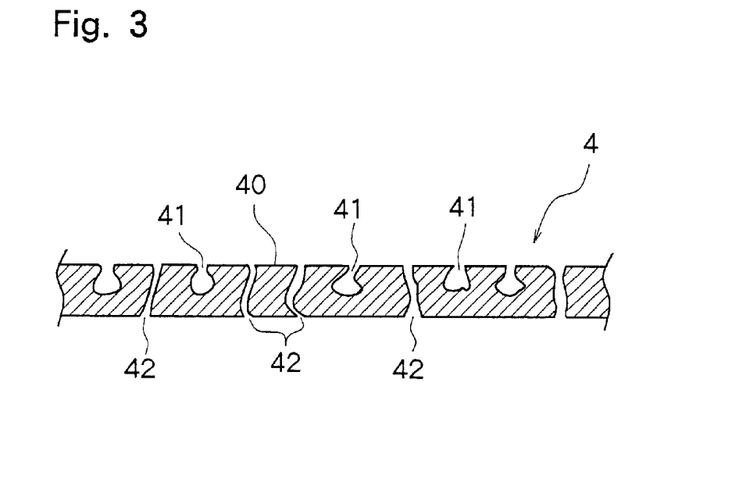
FIG. 3 is an enlarged sectional view of the elastic adhesive pad constituting the plate-like workpiece holding tray shown in FIG. 1.

The plate-like workpiece holding tray 2 in the illustrated embodiment consists of a disk-like substrate 3 and a disk-like elastic adhesive pad 4 mounted on the top surface of the substrate 3. The substrate 3 is made from a hard material such as aluminum or synthetic resin, has a thickness of approximately 1 mm and is constructed such that it does not bend easily. A plurality of through holes 31 penetrating through from the upper surface to lower surface are formed in the thus formed substrate 3. Although the substrate 3 is formed disk-like in the illustrated embodiment, the substrate 3 is desirably formed in conformity with the shape of a plate-like workpiece to be adhesively held thereon.

The above elastic adhesive pad 4 is formed from a material having elasticity such as a synthetic resin, for example, alkylbenzenesulfonic acid and the like in conformity with the shape of the substrate 3. Innumerable pores 41 are formed at least in the surface 40 of the thus formed elastic adhesive pad 4 as shown in the enlarged view of FIG. 3. Through holes 42 having a width of several tens of micrometers and penetrating through from the upper surface to lower surface are formed between adjacent pores 41 of the elastic adhesive pad 4 so that air can pass through the through holes 42. The thickness of the elastic adhesive pad 4 is determined in consideration of the properties of a workpiece but it is preferably approximately 0.5 mm. The elastic adhesive pad 4 is available from Dars bond Co., Ltd., for example. The elastic adhesive pad 4 constituted as described above is fixed on the top surface of the above substrate 3 by using an appropriate adhesive to constitute the plate-like workpiece holding tray 2 which consists of the substrate 3 and the elastic pad 4 integrated with each other.

A description is subsequently given of a method of picking up a plurality of semiconductor chips obtained by dividing a semiconductor wafer into semiconductor chips by so-called pre-dicing using the above plate-like workpiece holding tray 2.

Figure 4:
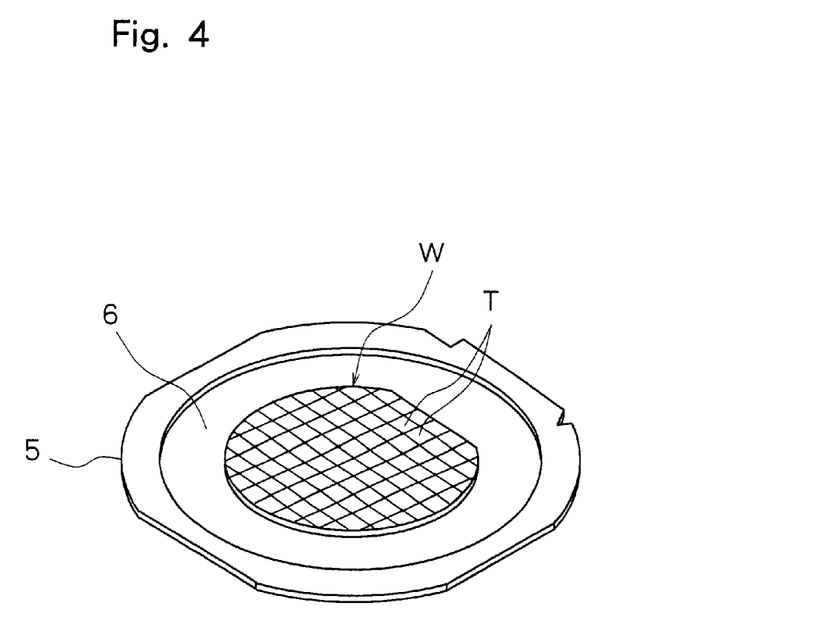
FIG. 4 is a perspective view showing a state of a semiconductor wafer held on a protective tape mounted on a ring frame being divided into a plurality of semiconductor chips.

To divide the semiconductor wafer into semiconductor chips by so-called pre-dicing, a protective tape 6 mounted on a ring frame 5 is affixed to the semiconductor wafer W as shown in FIG. 4. In this case, cutting grooves having a predetermined depth are already formed along predetermined cutting lines in the surface (surface having circuits formed thereon) of the semiconductor wafer W and the protective tape 6 is affixed to this surface. When the cutting grooves having a predetermined depth are thus formed in the surface and the back surface of the semiconductor wafer W, to which surface the protective tape 6 is affixed, is ground by a grinding machine until the above cutting grooves are exposed, the semiconductor wafer W is divided into a plurality of semiconductor chips T. The thus divided semiconductor chips T are not separated from one another by the action of the protective tape 6 and held on the protective tape 6 mounted on the ring frame 5.

Figure 5:
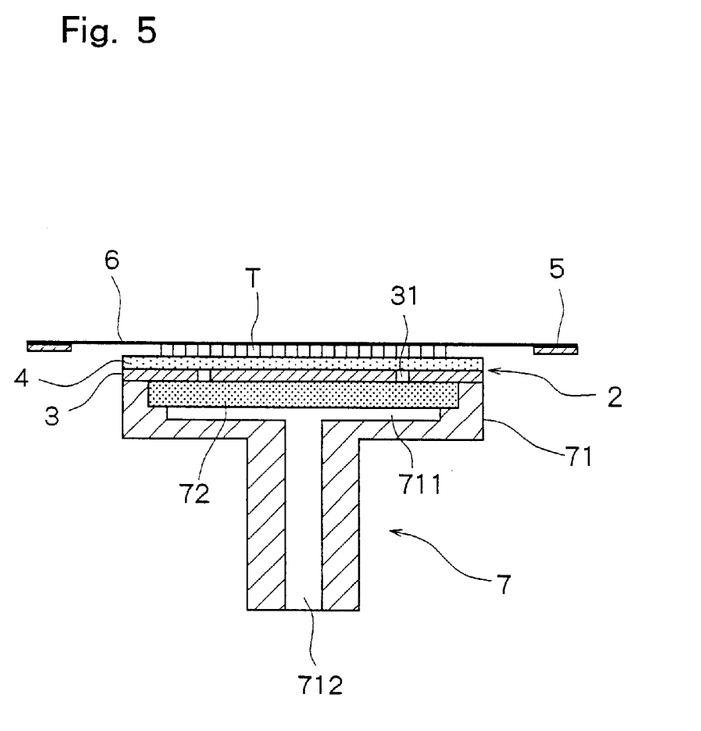
FIG. 5 is a diagram for explaining the step of holding a plurality of semiconductor chips affixed to the protective tape on the elastic adhesive pad of the plate-like workpiece holding tray shown in FIG. 1.

The plurality of semiconductor chips T formed by dividing the semiconductor wafer W and held on the protective tape 6 mounted on the ring frame 5, as described above, are caused to be held on the elastic adhesive pad 4 of the above plate-like workpiece holding tray 2 (semiconductor chip holding step). To hold the semiconductor chips T on the elastic adhesive pad 4 of the plate-like workpiece holding tray 2, an adhesive table 7 shown in FIG. 5 is prepared in the illustrated embodiment. The adhesion table 7 comprises a disk-like base 71 and a disk-like adhesively holding chuck 72. The base 71 is made from an appropriate metal material and has a hollow cylindrical portion 711 whose top is open and a communication passage 712 communicated with the hollow cylindrical portion 711. The communication passage 712 is connected to a negative pressure suction means (not shown). The adhesively holding chuck 72 is formed of a porous ceramic disk and is fitted in the hollow cylindrical portion 711 of the above base 71.

The substrate 3 of the above plate-like workpiece holding tray 2 is placed on the adhesively holding chuck 72 of the adhesion table 7 constituted as described above. The plurality of semiconductor chips T held by the protective tape mounted on the ring frame 5 are placed on the elastic adhesive pad 4 of the plate-like workpiece holding tray 2 placed on the adhesion table 7. At this time, the ground surfaces (back surfaces) of the semiconductor chips T which have been ground before the semiconductor wafer is divided into semiconductor chips T are put onto the surface of the elastic adhesive pad 4. When the negative pressure suction means (not shown) connected to the communication passage 712 is activated, negative pressure is introduced into the elastic adhesive pad 4 through the communication path 712, the hollow cylindrical portion 711, the absorption-holding chuck 72 and the through holes 31 formed in the substrate 3. As a result, the negative pressure acts on the plurality of semiconductor chips T placed on the top surface of the elastic adhesive pad 4 through the through holes 42 formed in the elastic adhesive pad 4 to cause the semiconductor chips T to be adsorbed to the elastic adhesive pad 4. At this time, the elastic adhesive pad 4 is compressed and the pores 41 formed in the surface 40 are crushed. As a result, negative pressure is produced in the pores 41 by restoration force generated by elasticity and adhesion of the elastic adhesive pad 4 even when the introduction of negative pressure through the through holes 31 formed in the substrate 3 of the plate-like workpiece holding tray 2 is released. This negative pressure serves as suction force for keeping the adhesive state of the semiconductor chips T. To adhesively hold the semiconductor chips T on the elastic adhesive pad 4 of the plate-like workpiece holding tray 2, the semiconductor chips T are pressed down to crush the above pores 41 after the semiconductor chips T are placed on the elastic adhesive pad 4, thereby making it possible to generate adhesive force in the elastic adhesive pad 4.

Figure 6:
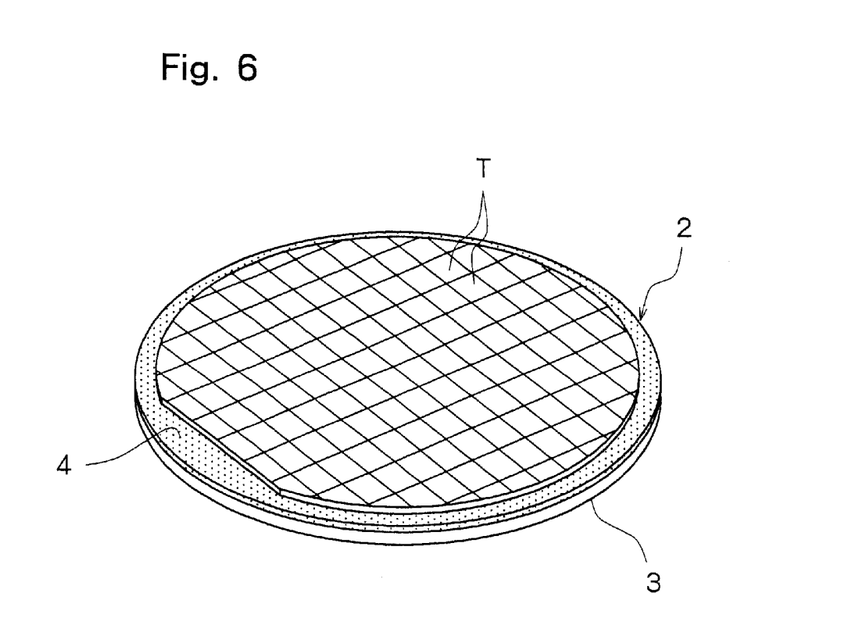
FIG. 6 is a perspective view showing a state of the plurality of semiconductor chips being held on the elastic adhesive pad of the plate-like workpiece holding tray shown in FIG. 1.

When the semiconductor chips T are, as described above, adhesively held on the elastic adhesive pad 4 of the plate-like workpiece holding tray 2, the above protective tape 6 is exposed to ultraviolet radiation to reduce its adhesion and the protective tape 6 is removed from the semiconductor chips T (protective tape removing step). Thereafter, the operation of the negative pressure suction means (not shown) is stopped to take off the plate-like workpiece holding tray 2 from the adhesion table 7, thereby making it possible to obtain a state of the plurality of semiconductor chips T being adhesively held on the top surface of the elastic adhesive pad 4 as shown in FIG. 6.

A description is subsequently given of the step of picking up the plurality of semiconductor chips T thus adhesively held on the plate-like workpiece holding tray 2 comprising the elastic adhesive pad 4 with reference to FIG. 7 and FIG. 8.

Figure 7:
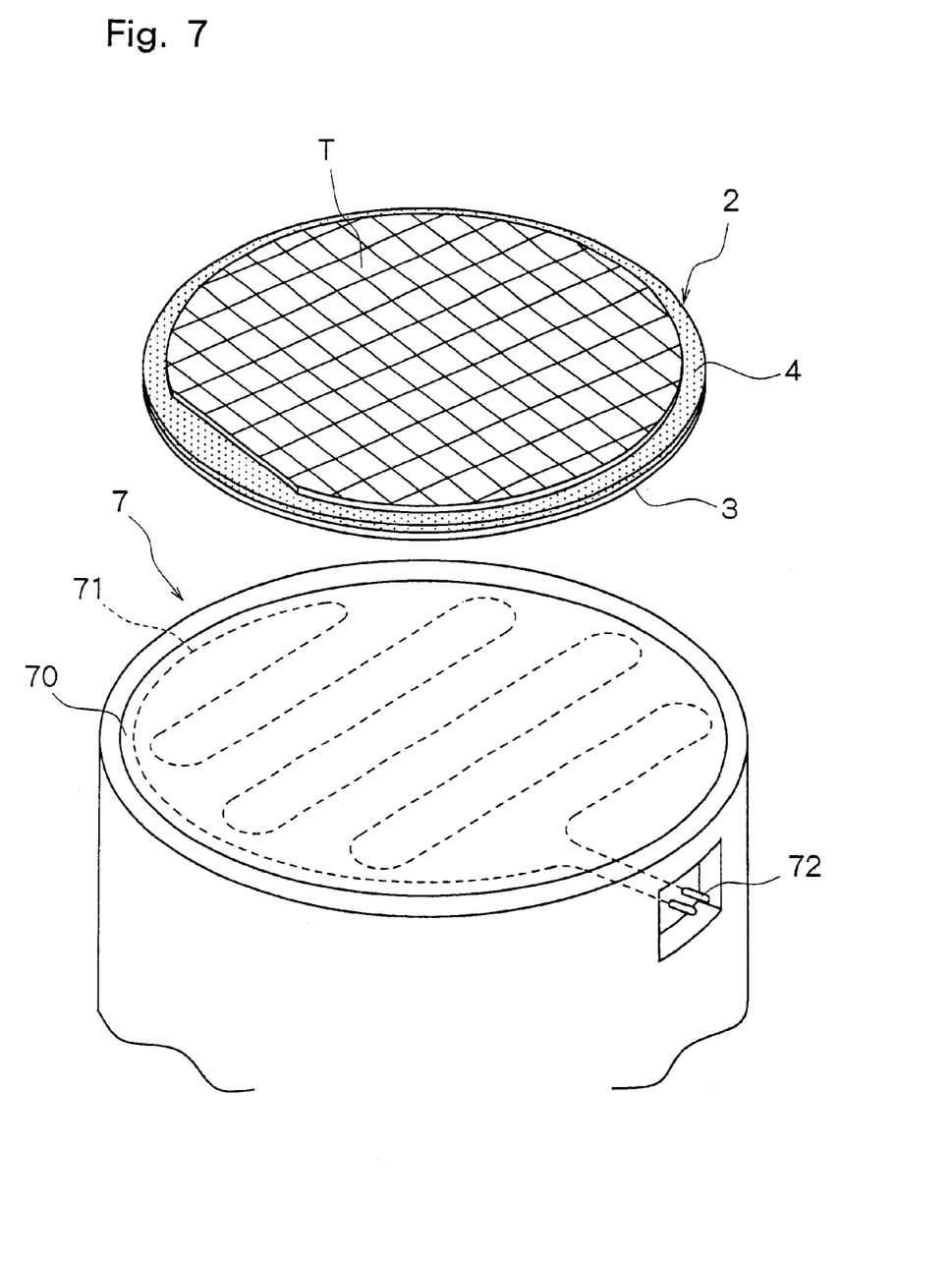
FIG. 7 is a perspective view of a heating table as a heating means for carrying out the pick-up method of the present invention.

In the illustrated embodiment, a heating table 7 shown in FIG. 7 is prepared. This heating table 7 comprises a heating portion 70 formed from an insulating material such as a ceramic and a heating wire 71 embedded in the heating portion 70, and the heating wire 71 is connected to a power source (not shown) via a connection terminal 72. The substrate 3 of the plate-like workpiece holding tray 2 which adhesively holds the plurality of semiconductor chips T is placed on the top surface of the heating table 7 constituted as described above, and the heating wire 71 is energized through the connection terminal 72. As a result, the top surface of the heating table 7 is heated to heat the elastic adhesive pad 4 via the substrate 3 of the plate-like workpiece holding tray 2. When the elastic adhesive pad 4 is heated, air remaining in the pores 41 expands, thereby canceling the negative pressure produced in all the pores 41. Therefore, the plurality of semiconductor chips T held on the elastic adhesive pad 4 of the plate-like workpiece holding tray 2 can be easily separated from the elastic adhesive pad 4. The heating temperature of the elastic adhesive pad 4 is enough if it allows air remaining in the pores 41 to expand to such an extent that the above negative pressure is canceled. According to experiments conducted in the present invention, it is preferably 40° C. to 60° C. which does not affect the quality of the semiconductor chips T.

Figure 8:
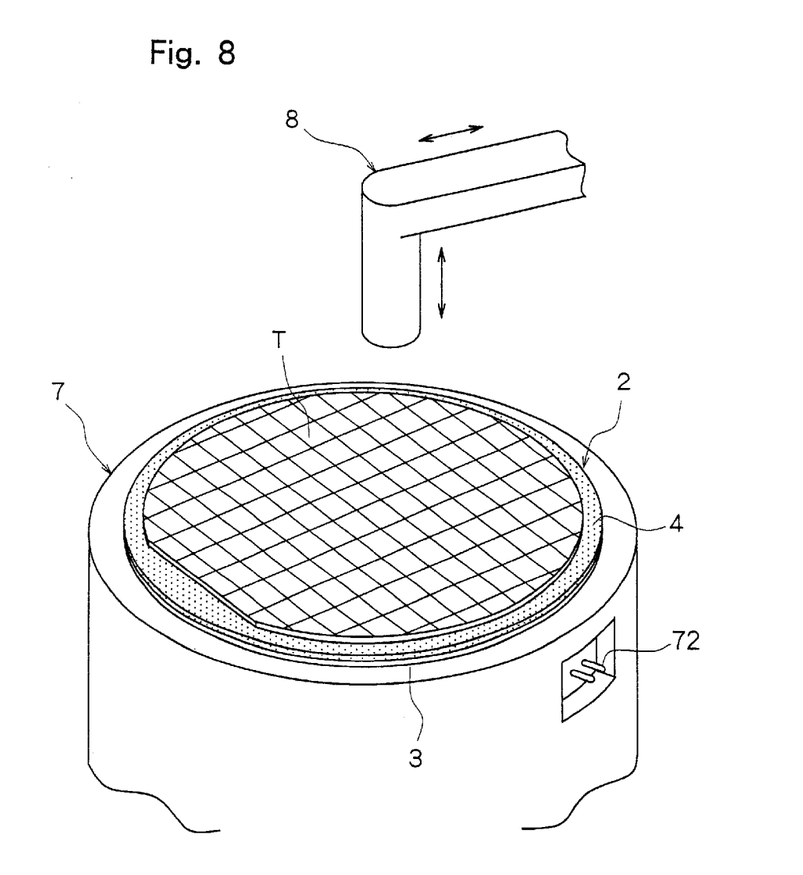
FIG. 8 is a perspective view showing the step of picking up the plurality of semiconductor chips held on the elastic adhesive pad of the plate-like workpiece holding tray mounted on the heating table shown in FIG. 7.

When the plurality of semiconductor chips T on the elastic adhesive pad 4 have become a state allowing to be easily separated as described above, a collet 8 constituting a pick-up device is activated as shown in FIG. 8 to pick up each of the semiconductor chips T and store it in a predetermined package or a conveying tray. The collet 8 may be a collet of a known type capable of vacuum-adsorbing the semiconductor chips T and carrying it through a predetermined route. When the plurality of semiconductor chips T can be picked up and transferred to the conveying tray en bloc, the collet 8 having a large adhesively holding portion is used to pick up them en bloc since the plurality of semiconductor chips T on the elastic adhesive pad 4 are heated and can be all easily separated.

A description is subsequently given of another embodiment of the method capable of separating the semiconductor chips T adhesively held on the plate-like workpiece holding tray 2 comprising the elastic adhesive pad 4, from the elastic adhesive pad 4 with reference to FIG. 9 and FIG. 10.

Figure 9:
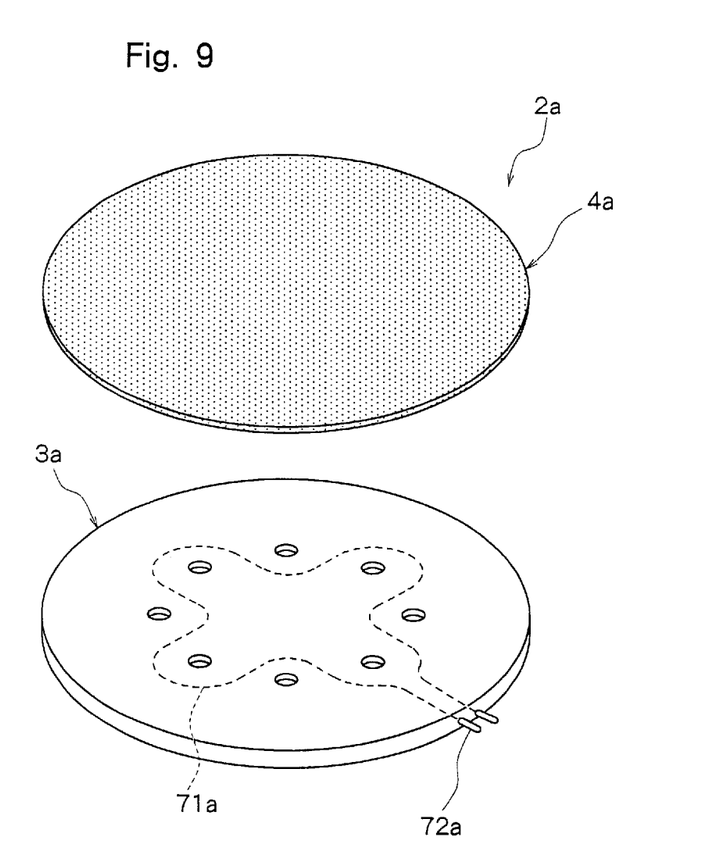
FIG. 9 is an exploded perspective view of another embodiment of the plate-like workpiece holding tray for carrying out the pick-up method of the present invention.
Figure 10:
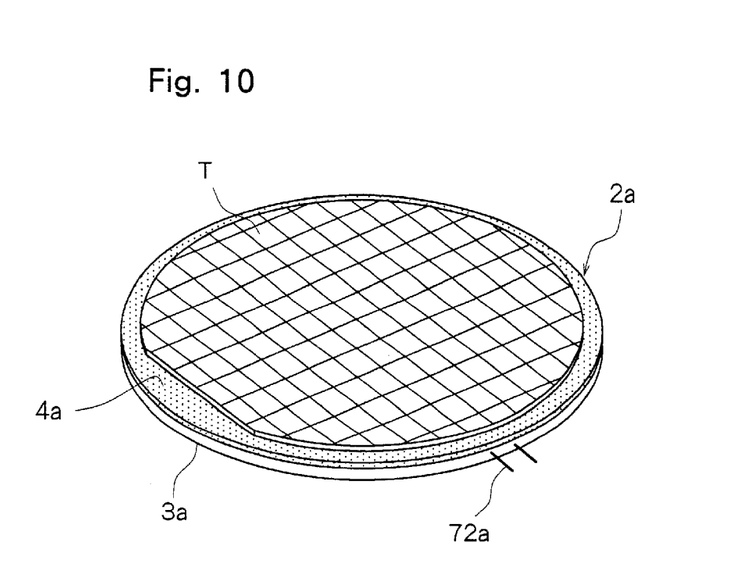
FIG. 10 is a perspective view showing a state of a plate-like workpiece being adhesively held on the plate-like workpiece holding tray shown in FIG. 9.

In the embodiment shown in FIG. 9 and FIG. 10, a plate-like workpiece holding tray 2a is provided with a heating means. That is, the plate-like workpiece holding tray 2a which consists of a substrate 3a and an elastic adhesive pad 4a mounted on the top surface of the substrate 3a is constituted such that a heating wire 71a is embedded in the substrate 3a and is connected to a power source (not shown) via connection terminals 72a. Therefore, by setting the plate-like workpiece holding tray 2a on a predetermined table constituting the pick-up device in a state of the plurality of semiconductor chips T being adhesively held on the elastic adhesive pad 4a as shown in FIG. 10 and energizing the heating wire 71a through the connection terminal 72a, the elastic adhesive pad 4a can be heated via the substrate 3a. As a result, air remaining in the pores 41 of the elastic adhesive pad 4a expands, whereby negative pressure produced in the pores 41 is canceled and there is obtained a state that the plurality of semiconductor chips T can be separated from the elastic adhesive pad 4a easily. Therefore, the semiconductor chips T can be picked up by the collet 8 as described above. To embed the heating wire 71a in the substrate 3a of the plate-like workpiece holding tray 2a shown in FIG. 9 and FIG. 10, the substrate 3a is desirably formed from an insulating material such as a ceramic and must be formed thicker than that of the embodiment shown in FIG. 1.

A description is subsequently given of an example where the above collet 8 is provided with a means of heating the elastic adhesive pad 4 with reference to FIG. 11.

Figure 11:
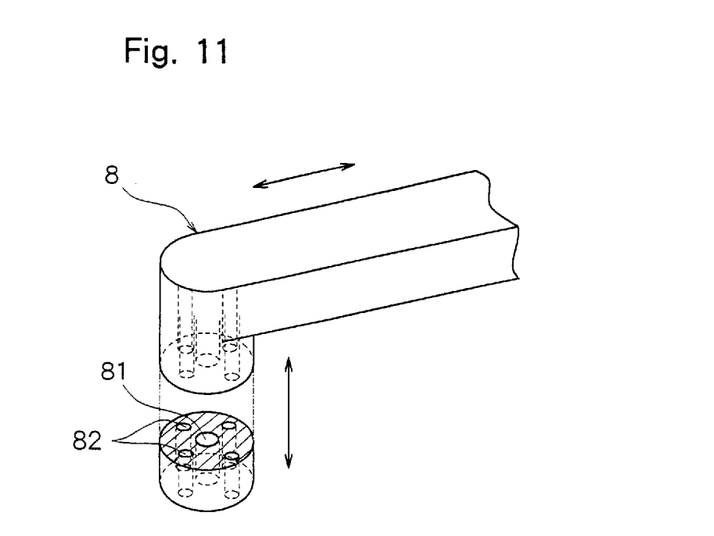
FIG. 11 is a perspective view of the main portion of another embodiment of a collet for carrying out the pick-up method of the present invention.

The collet 8 in the embodiment shown in FIG. 11 comprises a gas passage 81 that is formed in the center and is connected to a means of supplying a hot gas and negative pressure passages 82 that are formed on the periphery side of the gas passage 81 and are connected to a negative pressure suction means. To pick up the plurality of semiconductor chips T adhesively held on the elastic adhesive pad 4 by using the collet 8 thus constituted, the collet 8 is moved above a semiconductor chip T to be picked up, and a hot gas is jetted out from the gas passage 81 to heat the semiconductor chip T to be picked up on the elastic adhesive pad 4. As a result, air remaining in the pores 41 of the heated portion of the elastic adhesive pad 4 expands, whereby negative pressure produced in the pores 41 is canceled and the semiconductor chip T to be picked up is brought in a state that it can be easily separated from the elastic adhesive pad 4. In this state, the jetting-out of the hot gas is stopped, the collet 8 is brought into contact with the semiconductor chip T to be picked up, and the negative suction means is activated to introduce negative pressure into the negative pressure passages 82, thereby making it possible for the collet 8 to suck and pick up the semiconductor chip T to be picked up.

A description is subsequently given of another embodiment of the above semiconductor chip holding step, that is, the step of holding the plurality of semiconductor chips T which are formed by dividing the semiconductor wafer W and are affixed to the protective tape 6 mounted on the ring frame 5, on the elastic adhesive pad 4 of the plate-like workpiece holding tray 2, with reference to FIGS. 12.

Figure 12:
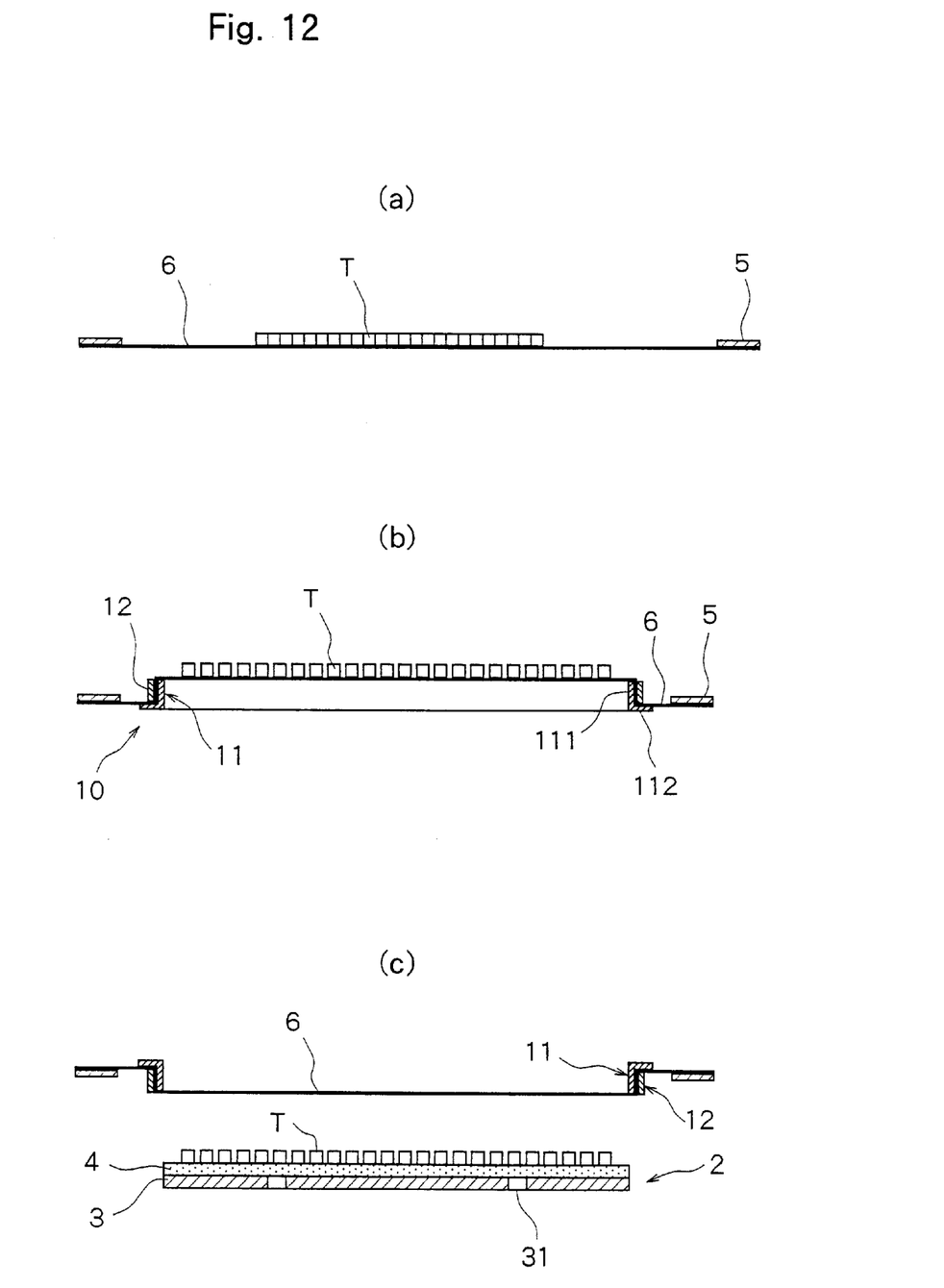
FIGS. 12 are diagrams for explaining other embodiments of the holding step in the pick-up method of the present invention.

This embodiment includes the step of stretching the protective tape 6 in a state of the plurality of semiconductor chips T formed by dividing the semiconductor wafer being affixed to the protective tape 6 mounted on the ring frame 5 as shown in FIG. 12(a). An embodiment of this protective tape stretching step will be described with reference to FIG. 12(b). In the embodiment shown in FIG. 12(b), a stretching jig 10 is prepared. The illustrated stretching jig 10 consists of an inner ring 11 and an outer ring 12. The inner ring 11 has a mounting portion 111 and a collar portion 112 projecting outward in a radial direction from the lower end of the mounting portion 111. The outer ring 12 has an inner diameter slightly larger than the outer diameter of the mounting portion 111 of the above inner ring 11. To carry out the protective tape stretching step by using the stretching jig 10 constituted as described above, the protective tape 6 mounted on the ring frame 5 shown in FIG. 12(a) is placed on the top surface of the inner ring 11. At this point, the plurality of semiconductor chips T affixed to the protective tape 6 are situated on the inner side of the inner ring 11. By fitting the outer ring 12 onto the mounting portion 111 of the inner ring 11 in this state from above, the protective tape 6 is stretched and interposed between the mounting portion 111 and the inner wall of the outer ring 12 as shown in FIG. 12(b). As a result, the protective tape 6 is stretched, thereby broadening the interval between adjacent semiconductor chips T affixed to the protective tape 6. Thus, the plurality of semiconductor chips T are held on the elastic adhesive pad 4 of the plate-like workpiece holding tray 2 as shown in FIG. 12(c) in a state that the interval between adjacent semiconductor chips T is broadened by stretching the protective tape 6. The step of holding the plurality of semiconductor chips T on the elastic adhesive pad 4 of the plate-like workpiece holding tray 2 and the step of separating the protective tape 6 may be similar to the above described steps.

Since according to the semiconductor chips holding step shown in FIG. 12, it includes the protective tape stretching step shown in FIG. 12(b), the intervals between adjacent semiconductor chips T held on the elastic adhesive pad 4 of the plate-like workpiece holding tray 2 are broadened. Therefore, the semiconductor chips are not contacted with one another when they are picked up, thereby making it possible to prevent damage caused by contact between semiconductor chips T.

Since the semiconductor pick-up method of the present invention is constituted as described above, the following function and effect are obtained.

That is, the semiconductor chip pick-up method of the present invention comprises the step of adhesively holding a plurality of semiconductor chips formed by dividing a semiconductor wafer on an elastic adsorption pad which has innumerable pores formed in the surface and generates adhesive force when negative pressure is produced by the pores crushed by restoration force generated by elasticity and adhesion and the step of picking up the semiconductor chips in a state of air in the pores being expanded by heating the elastic adhesive pad which adhesively holds the plurality of semiconductor chips, at a predetermined temperature. Therefore, it is possible to pick up the plurality of semiconductor chips held on the elastic adhesive pad unforcedly and easily. Consequently, the plurality of semiconductor chips T held on the elastic adhesive pad can be prevented from being damaged when they are picked up. When the plurality of semiconductor chips can be picked up and transferred to a conveying tray en bloc, the entire elastic adhesive pad is heated to bring the plurality of semiconductor chips into a state that they can be all separated easily, whereby they can be picked up en bloc by using a pick-up device having a large holding portion. Further according to the present invention, since the step of stretching the protective tape affixed to the plurality of semiconductor chips is included in the semiconductor chip holding step, the interval between adjacent semiconductor chips held on the elastic adhesive pad is broadened. Therefore, when the semiconductor chips are picked up, they are not contacted with one another and can be prevented from being damaged by contact.

What is claimed is:

1. A method of picking up a plurality of semiconductor chips formed by dividing a semiconductor wafer, comprising:

holding by adhesion the plurality of semiconductor chips on an elastic adhesive pad, wherein said pad has innumerable pores formed in the surface and generates an adhesive force when negative pressure is produced by restoration force generated by elasticity and adhesion of the pores after the pores have been crushed; and picking up the semiconductor chips wherein said picking up includes expanding said pores by heating the elastic adhesive pad, which adhesively holds the plurality of semiconductor chips, at a predetermined temperature.

2. A method of picking up a plurality of semiconductor chips formed by dividing a semiconductor wafer by forming cutting grooves having a predetermined depth in the surface of the semiconductor wafer, affixing a protective tape to the surface having the cutting grooves formed therein and grinding the back surface of the semiconductor wafer until the cutting grooves are exposed, comprising:

holding by adhesion the plurality of semiconductor chips on an elastic adhesive pad, wherein said pad has innumerable pores formed in the surface and generates an adhesive force when negative pressure is produced by restoration force generated by elasticity and adhesion of the pores after the pores have been crushed, by putting the ground surfaces of the plurality of semiconductor chips, to which the protective tape has been affixed, to the elastic adsorption pad;

separating the protective tape affixed to the semiconductor chips adhesively held on the elastic adsorption pad from the semiconductor chips; and picking up the semiconductor chips wherein said picking up includes expanding said pores by heating the elastic adhesive pad, which adhesively holds the plurality of semiconductor chips, at a predetermined temperature.

3. The method according to claim 2, wherein the semiconductor chip holding step includes stretching the protective tape to broaden the interval between adjacent semiconductor chips.

* * * * *